United States Patent

Gill et al.

[11] Patent Number: 5,100,819
[45] Date of Patent: Mar. 31, 1992

[54] METHOD OF MAKING ELECTRICALLY PROGRAMMABLE AND ERASABLE MEMORY CELLS WITH FIELD PLATE CONDUCTOR DEFINED DRAIN REGIONS

[75] Inventors: Manzur Gill, Rosharon; Sebastiano D'Arrigo, Houston, both of Tex.

[73] Assignee: Texas Instruments Incorporated, Dallas, Tex.

[21] Appl. No.: 618,786

[22] Filed: Nov. 27, 1990

Related U.S. Application Data

[60] Continuation of Ser. No. 523,696, May 15, 1990, abandoned, which is a division of Ser. No. 385,846, Jul. 26, 1989, Pat. No. 4,947,222, which is a continuation-in-part of Ser. No. 219,529, Jul. 15, 1988, abandoned.

[51] Int. Cl.⁵ .......................................... H01L 21/265
[52] U.S. Cl. .......................................... 437/43; 437/48; 437/49; 437/50; 437/52; 437/61; 357/23.5; 357/23.6
[58] Field of Search .......................... 437/43, 48, 49, 50, 437/52, 61; 357/23.6, 23.5

[56] References Cited

U.S. PATENT DOCUMENTS

| | | | |
|---|---|---|---|
| 4,384,349 | 5/1983 | McElroy | 365/185 |
| 4,558,339 | 12/1985 | Angle | 357/23.5 |
| 4,608,591 | 8/1986 | Ipri et al. | 357/23.5 |
| 4,736,342 | 4/1988 | Imondi et al. | 365/94 |

*Primary Examiner*—Brian E. Hearn
*Assistant Examiner*—Gordon V. Hugo
*Attorney, Agent, or Firm*—W. James Brady, III; James T. Comfort; Melvin Sharp

[57] ABSTRACT

First and second EEPROM cells have first and second source regions (28a, 28b) formed in a semiconductor layer (12) to be of a second conductivity type opposite the first conductivity type of the layer and to be spaced apart from each other. A field plate conductor (100) is insulatively disposed adjacent, and defines, an inversion region (102), and further is laterally spaced between the first and second source regions (28a, 28b). The inversion region (102) is inverted from the first conductivity type to the second conductivity type upon application of a predetermined voltage to the field plate conductor (100). First and second channel regions (48a, 48b) are defined between the respective source regions (28a, 28b) and the inversion region (102) and each include floating gate and control gate subchannel regions (60a, 62a, 62b, 60b). First and second floating gate conductors (40a, 40b) are insulatively disposed adjacent respective floating gate subchannel regions (60a, 60b) to control their conductance. A control gate conductor is insulatively disposed adjacent the control gate subchannel regions (62a, 62b) to control their conductance. In another embodiment, the field plate conductor (100) is replaced with a pair of field plate conductors (42a, 42b) that control the conductance of respective subchannel regions (64a, 64b). The field plate conductors (42a, 42b) act to self-align a diffused drain region (46) that replaces the inversion region (102).

28 Claims, 10 Drawing Sheets

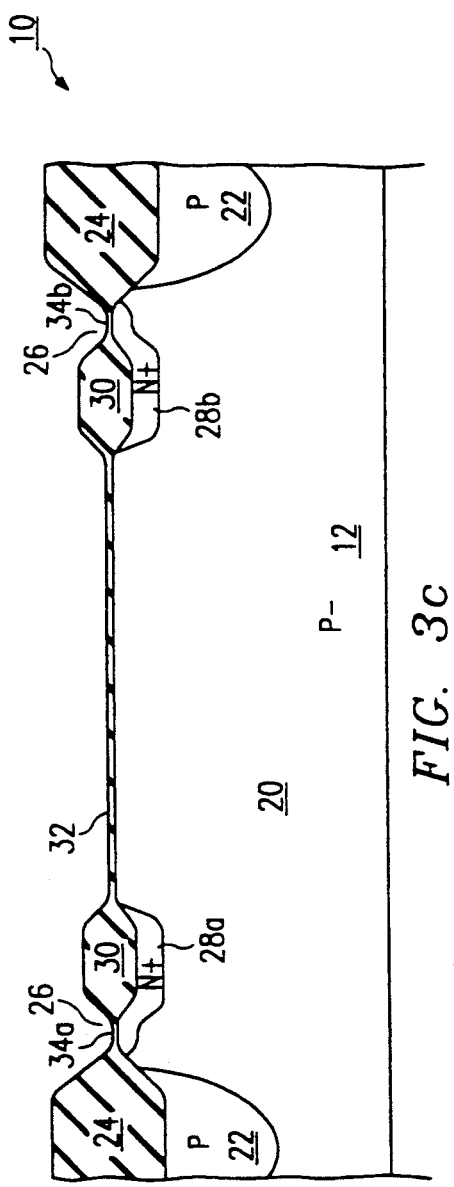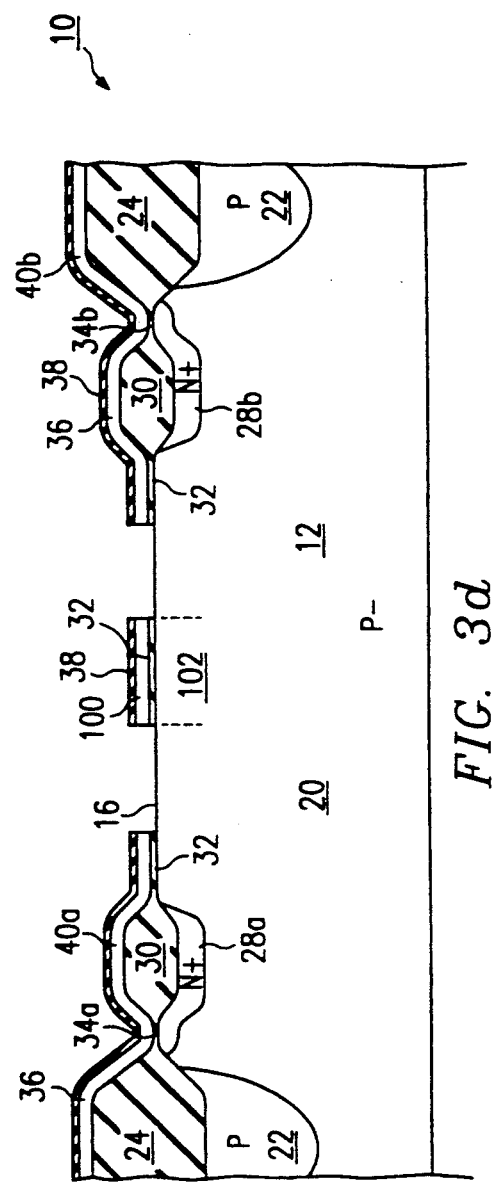

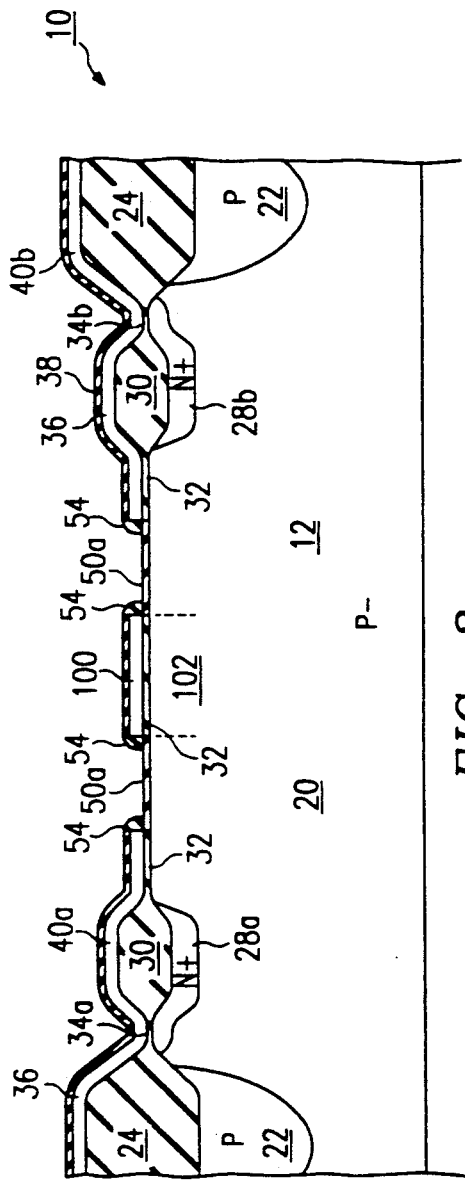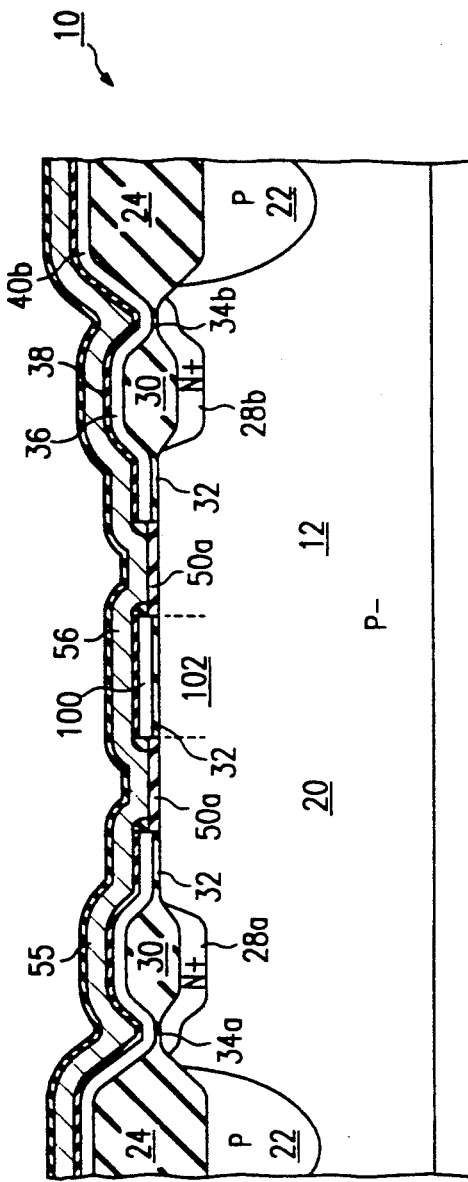

METHOD OF MAKING ELECTRICALLY PROGRAMMABLE AND ERASABLE MEMORY CELLS WITH FIELD PLATE CONDUCTOR DEFINED DRAIN REGIONS

RELATED APPLICATIONS

This application is a continuation of U.S. patent application Ser. No. 07/523,696, filed May 15, 1990, now abandoned, which is a division of U.S. patent application Ser. No. 07/385,846, filed July 26, 1989, now U.S. Pat. No. 4,947,222, which is a continuation-in-part of U.S. patent application Ser. No. 07/219,529, filed July 15, 1988, now abandoned; and is further related to U.S. patent application Ser. No. 07/219,530, filed July 15, 1988, now abandoned, U.S. patent application Ser. No. 07/219,528, filed July 15, 1988, now abandoned, U.S. patent application Ser. No. 07/374,381, filed June 30, 1989; U.S. patent application Ser. No. 07/374,113, filed June 30, 1989; and U.S. patent application Ser. No. 07/458,936, filed Dec. 29, 1989.

TECHNICAL FIELD OF THE INVENTION

The present invention relates generally to electrically erasable and programmable read only memories (EEPROMs), and more particularly to an EEPROM cell and array having a field plate conductor defining a drain region.

BACKGROUND OF THE INVENTION

EPROMs, or electrically-programmable ROMs, are field-effect devices with a floating-gate structure. An EPROM floating gate is programmed by applying proper voltages to the source, drain and control gate of each cell, causing high current through the source-drain path and the charging of the floating gate by hot electrons. The EPROM device is erased by ultraviolet light, which requires a device package having a quartz window above the semiconductor chip. Packages of this type are expensive in comparison with the plastic packages ordinarily used for other memory devices such as DRAMs (dynamic random-access memories). For this reason, EPROMs are generally more expensive than plastic-packaged devices. EPROM devices of this type, and methods of manufacture, are disclosed in U.S. Pat. Nos. 3,984,822, 4,142,926, 4,258,466, 4,376,947, 4,326,331, 4,313,362, and 4,373,248. Of particular interest to this invention is U.S. Pat. No. 4,750,024, issued June 7, 1988 to John F. Schreck and assigned to Texas Instruments Incorporated, wherein an EPROM is shown to be made by a method similar to that of U.S. Pat. No. 4,258,466, but with an offset floating gate.

EEPROMs, or electrically-erasable, electrically-programmable ROMs, have been manufactured by various processes, usually requiring a much larger cell size than standard EPROMs, and requiring more complex manufacturing processes. EEPROMs can be mounted in opaque plastic packages that reduce the packaging cost. Nevertheless, EEPROMs have been more expensive on a per-bit basis, in comparison with EPROMs, due to larger cell size and to more complex manufacturing processes.

Flash EEPROMs have the advantage of smaller cell size in comparison with standard EEPROMs because the cells are not erased individually. Instead, the array of cells is erased in bulk.

Prior flash-erasable, Fowler-Nordheim tunneling-programmable EEPROMs have usually required two bit lines per cell. Texas Instruments' co-pending application Ser. No. 07/219,529, now abandoned illustrates an example of an array of such cells. For each column of cells in this array, two parallel bit lines are diffused into the face of the semiconductor layer, one each for the source and drain. Respective metal bit lines overlie and run parallel to the diffused source and drain bit lines. Usually, the pitch of the metal bit lines is a critical limitation in down-scaling the size of the array. As the search continues for devices of smaller and smaller area having the same functionality, it has therefore become desirable to devise an EEPROM cell having less than two bit lines per memory cell.

SUMMARY OF THE INVENTION

The present invention presents a distinct advantage over prior art flash-erasable EEPROMs in that each cell shares a drain bit line with another cell, and therefore uses only 1½ metal bit lines per cell, thus saving array area and relaxing metal pitch.

According to one aspect of the invention, an array of cells has a plurality of memory cell pairs. Each pair of memory cells have first and second source regions that are formed at a face of a semiconductor layer to be of a second conductivity type opposite the conductivity type of the layer itself. The first and second source regions are spaced apart from one another.

A field plate conductor is insulatively disposed adjacent the face of the semiconductor layer and is laterally spaced from, and is disposed between, the first and second source regions. An inversion region in the semiconductor layer is defined by the field plate conductor and is inverted from the first conductivity type to the second conductivity type upon application of a predetermined voltage to the field plate conductor. A first channel region is defined in the semiconductor layer between the first source region and the inversion region, while a second channel region is defined in the layer between the second source region and the inversion region. Each of the channel regions comprises floating gate and control gate subchannel regions.

First and second floating gate conductors are insulatively disposed adjacent respective ones of the first and second source regions so as to be capable of being programmed thereby. Each of the floating gate conductors is further insulatively disposed adjacent a respective floating gate subchannel region to control its conductance. A control gate conductor is insulatively disposed adjacent the control gate subchannel regions to control their conductance and is further insulatively disposed adjacent the floating gate conductors for their programming and erasure.

According to another aspect of the invention, the above pair of cells is located within an array of such cells formed in columns and rows. Source regions and inversion regions are formed or defined to be elongate in a column direction, while a word line conductor is provided for each row. At least one inversion region contact is formed at the face of the semiconductor layer to be of the second conductivity type and to be spaced between two predetermined adjacent rows. This contact region is adjacent the elongate inversion region, such that contact may be made to any cell associated with the elongate inversion region.

According to a further aspect of the invention, the inversion region as described above is replaced by an implanted drain region. The field plate conductor is split into two field plate conductors disposed on either side of the drain region the two field plate conductors and the conductance of a third subchannel region in each of the respective channel regions. The field plate conductors act as a self-aligned mask for the implantation of the drain region.

The present invention has a significant technical advantage in that two columns of cells share a single drain region (or a single inversion region replacing it), thus obviating the need for a drain region for each column and relaxing the minimum metal line pitch.

BRIEF DESCRIPTION OF THE DRAWINGS

Other aspects of the invention and their advantages will be discerned when one refers to the following detailed description as taken in conjunction with the drawings, in which:

FIGS. 3a–3g are greatly enlarged schematic elevational sectional views of a semiconductor layer showing progressive stages in the fabrication of a pair of EEPROM cells according to a second embodiment of the invention;

DETAILED DESCRIPTION OF THE INVENTION

Figure 1A:
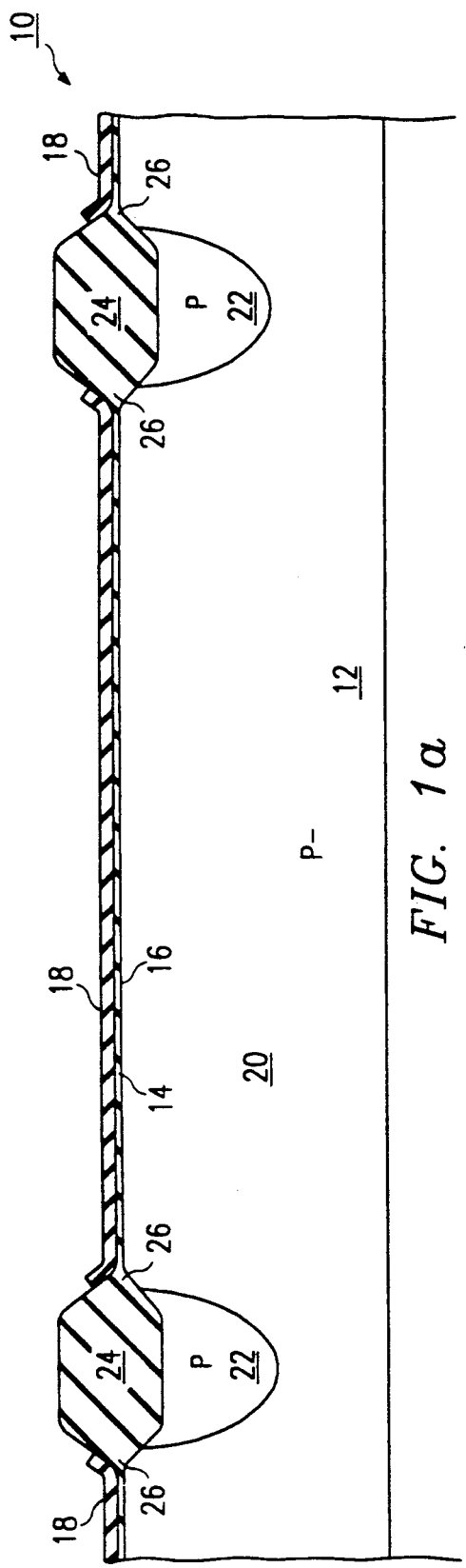
FIGS. 1a–1g are greatly enlarged schematic elevational sectional views of a semiconductor layer showing progressive stages in the fabrication of a pair of EEPROM cells according to a first embodiment of the invention.

Referring first to FIG. 1a, a semiconductor substrate or layer 10 is shown having a (P−) epitaxial layer 12 grown thereon. A layer 14 of oxide is deposited or grown on the surface 16 of the (P−) layer 12. This is followed by the deposition of a nitride layer 18 on top of the oxide layer 16. The nitride layer 18 is patterned and etched to define an active device area 20 over which the nitride layer 18 resides, which will later include a drain region, two source regions and two channel regions of a pair of EEPROM cells (described below).

The fabrication process detailed herein omits steps necessary for the cofabrication of a plurality of CMOS logic transistors sited in the periphery of the chip. Since the techniques for fabricating such transistors are conventional, they will not be described here.

A boron implant at a dose of approximately $8 \times 10^{12}$ cm$^{-2}$ is performed to create (P) channel stop regions 22. Then, thick field oxide regions 24 are thermally grown in a localized oxidation process to a thickness of approximately 9000 Angstroms by exposing the substrate to steam at about 900° C. for several hours, using any of several conventional techniques. The thermal oxide regions 24 grow beneath the edges of adjacent nitride layers 18, creating bird's beaks 26 instead of sharp transitions.

Figure 1B:
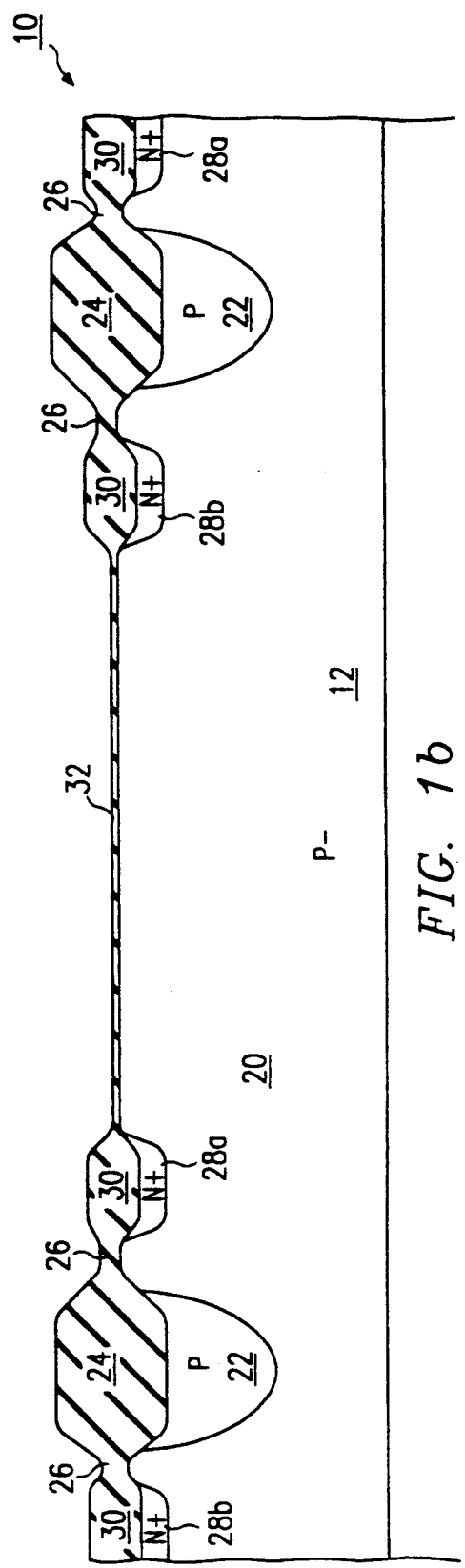

Referring next to FIG. 1b, the nitride layer 18 is removed. A layer (not shown) of photoresist is deposited and patterned to act as an implant mask for an arsenic implant at a dose of about $6 \times 10^{15}$ cm$^{-2}$ and at an energy of about 135 KeV. This implant creates a pair of source regions 28a and 28b inside the active device area 20. As will be later explained in conjunction with FIG. 2, each active device area 20 is an elongate column in connection with which several pairs of EEPROM cells are developed. Only one complete pair of such cells is shown in the section taken in FIGS. 1a–1g.

Following the implant of the source regions 28a and 28b, another thermal step is performed with steam at 800° to 900° C. to differentially grow oxide regions 30. The oxide regions 30 are grown to a thickness of approximately 2500 to 3500 Angstroms. At the same time, a thinner oxide layer 32 is formed between the source regions 28a and 28b, and may have a thickness of approximately 200 to 300 Angstroms. This oxidation step may be adjusted to change the thickness of the oxide layer 32, and therefore the final thickness of the gate oxide as described below.

At the transition areas 26 where bird's beaks have been formed, the edge of the originally-formed thermal oxide masks the arsenic implant so that the arsenic concentration is lower. Therefore, the oxide growth in those areas is less than that of the oxide 30.

Figure 1C:
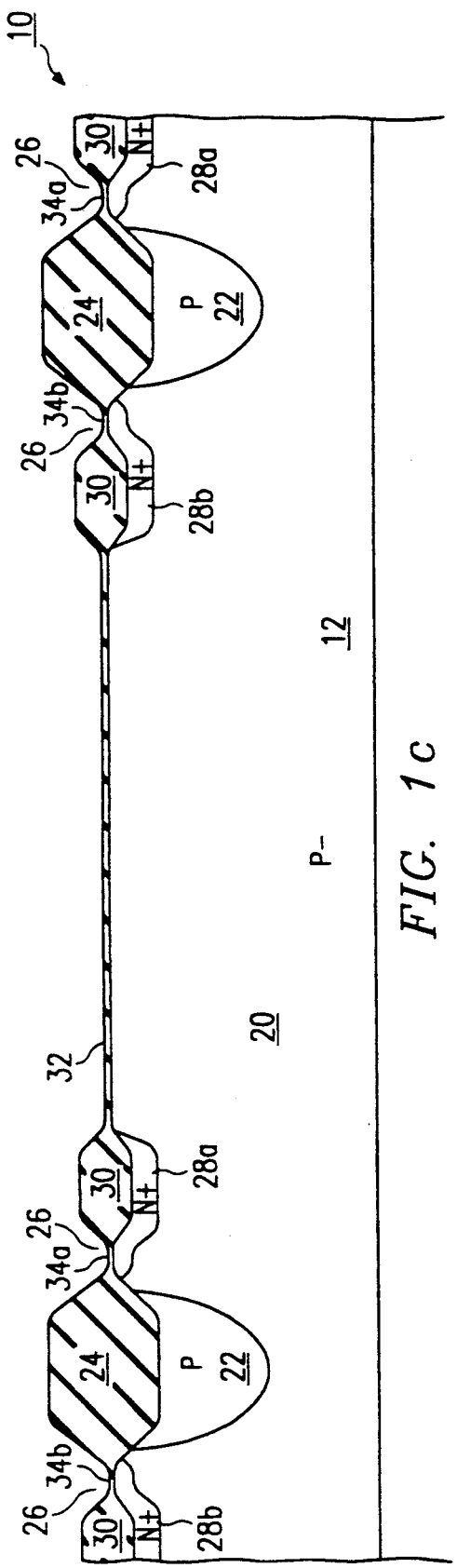

Referring next to FIG. 1c, windows are opened in the oxide at the transition areas 26. This is done by etching through the oxide over the transition areas 26 to the silicon underneath using photoresist as a mask, and then regrowing a thinner oxide for the tunnel windows 34a and 34b. Because of the curved surface of the transition areas 26, the width of the tunnel windows 34a and 34b may be controlled by varying the length of the time for the etch of the transition areas 26. This will create window oxide layers 34a and 34b that are approximately 100 Angstroms thick. At the time that this oxidation occurs, the gate oxide layer 32 will grow to approximately 350 Angstroms, depending on its thickness before this step which may be adjusted as described above. A light phosphorus implant is preferably made through the tunnel windows 34a and 34b to improve the operation of the cells.

Figure 1D:
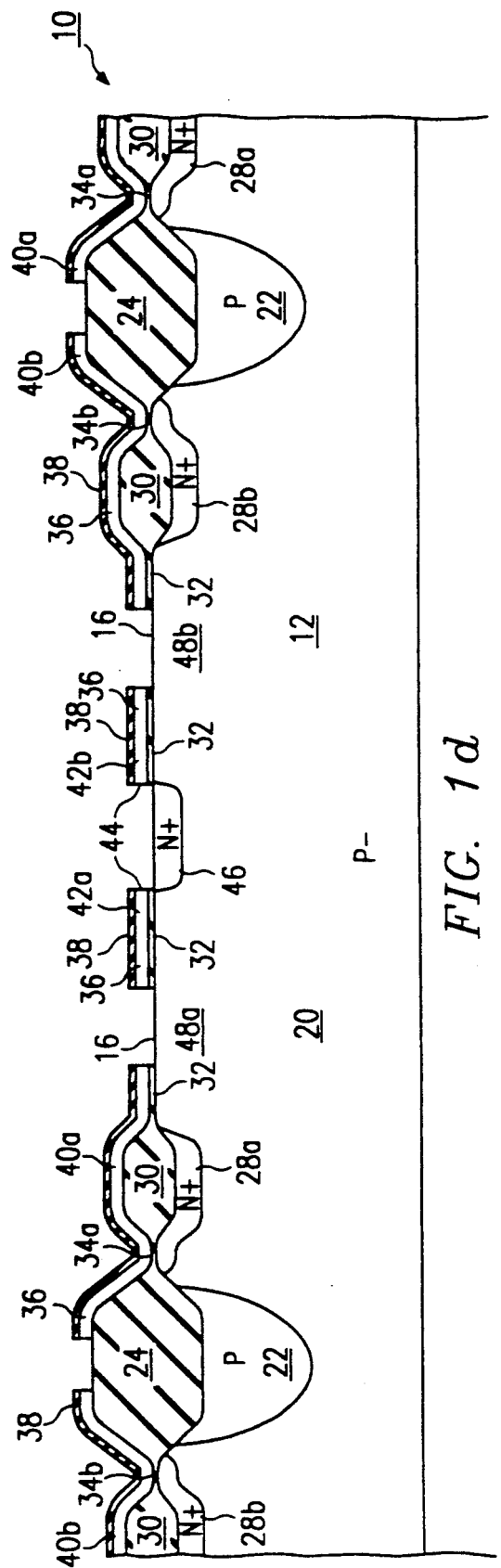

Referring next to FIG. 1d, a first layer 36 of polycrystalline silicon (polysilicon) is deposited over the face of the slice. Layer 36 is deposited to a thickness of approximately 3500 Angstroms. The polysilicon layer 36 (also known as the "poly 1" layer) is highly doped to render it conductive. This may be accomplished, for example, by applying an (N+) dopant to the polysilicon layer 36 after it has been deposited. A relatively thin interlevel insulator layer 38, such as an oxide/nitride/oxide (ONO) sandwich, is next formed on the poly layer 36 using conventional techniques.

The ONO layer 38 is next patterned and etched, followed by a self-aligned plasma etch of the polysilicon layer 36 to partially define first and second floating gate conductors 40a and 40b, as well as first and second poly 1 field plate conductors 42a and 42b. This etching step defines the floating gate conductors 40a and 40b in an x direction only, where x is coplanar with and horizontal within the section shown in FIGS. 1a–1g. In a y direction perpendicular to the paper, the conductors 40a, 40b, 42a and 42b exist at this point as long parallel strips stretching over every pair of future cells in the same column as the illustrated cells. The definition of the floating gate conductors 40a and 40b in a y direction occurs through a stack etch described below. After the etch described above, the exposed areas of oxide layer 32 are stripped away from the silicon surface 16.

Next, the face is patterned with photoresist and interior edges 44 of the field plate conductors 42a and 42b are used to self-align an implantation of an (N) type dopant into the semiconductor face 16 to create a highly doped (N+) drain region 46. The photoresist is then stripped and the (N+) implants 28a, 28b and 46 are annealed. The implantation and anneal of the drain region 46 leaves a (P) type first channel region 48a between the source region 28a and drain region 46, and a (P) type second channel region 48b between the drain region 46 and the source region 28b.

Figure 1E:
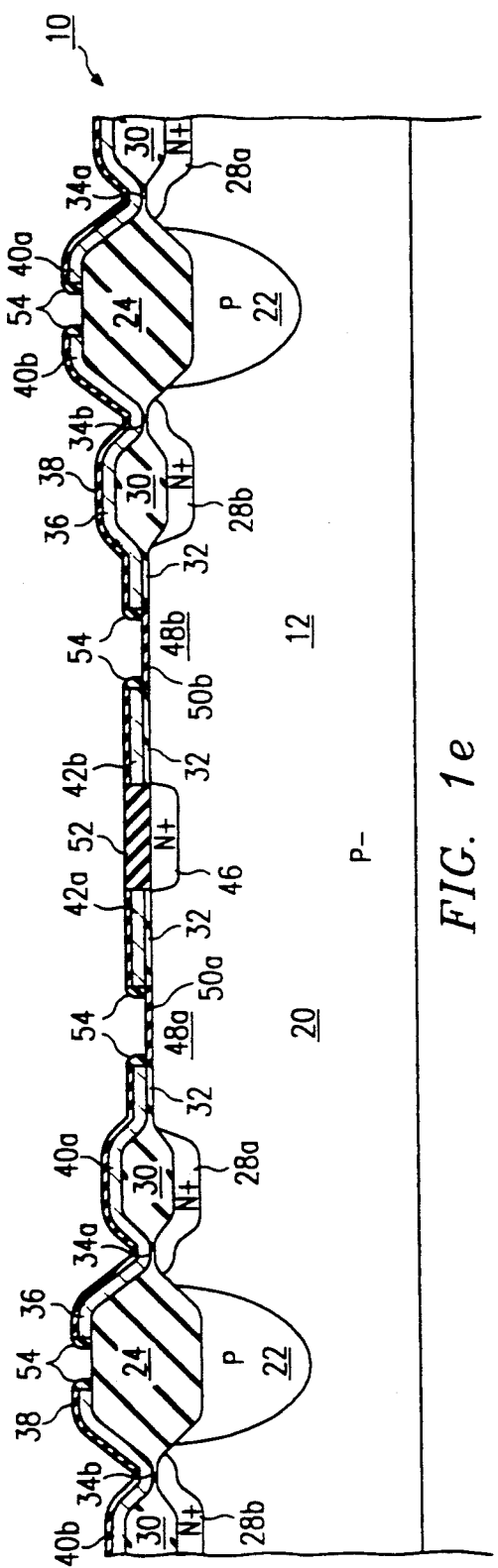

Referring now to FIG. 1e, an oxidation step is performed to grow new gate oxide layers 50a, 52 and 50b. Oxide layers 50a and 50b will grow to a thickness of approximately 400 to 500 Angstroms. Because of the dopant impurity in drain region 46, oxide layer 52 will in the meantime grow to a thickness of 1000 to 4000 angstroms. Oxide regions 54 will also grow at this time from the exposed ends of the polysilicon gate conductors 40a and 40b and of the field plate conductors 42a and 42b.

Figure 1F:
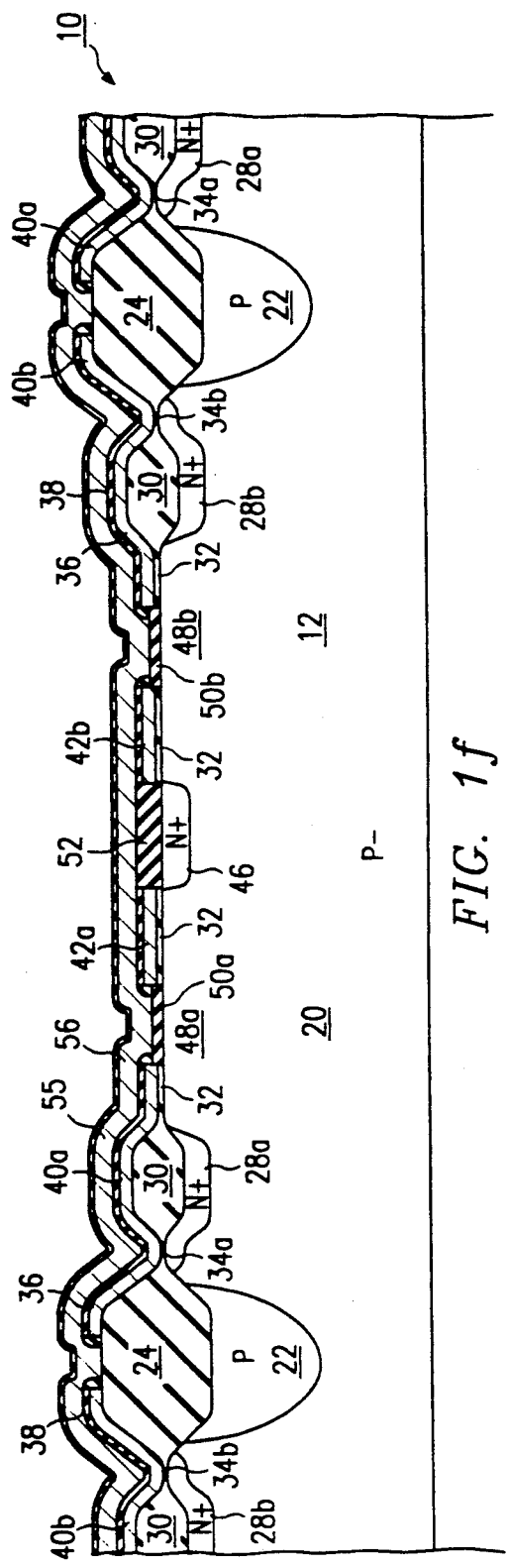

Referring next to FIG. 1f, a second polycrystalline silicon layer 55 ("poly 2") is then deposited over the face of the slice and is highly doped to be (N+) and conductive. The polysilicon layer 55 is deglazed. Then, a stack etch of (1) the second polysilicon layer 55, (2) the interlevel insulator layer(s) 38, and (3) the first poly floating gate conductors 40a and 40b is performed. This stack etch defines a plurality of elongate word line conductors 56 which run substantially parallel to each other in an x direction and which are spaced apart from one another in a y direction. The same stack etch separates and defines the floating gate conductors 40a and 40b in a y direction. The field plate conductors 42a and 42b are masked such that they will continue to be elongate conductors running in the y direction. After the stack etch process, the poly 2 above the field plate conductor can be etched in the same step when the peripheral logic CMOS device gates are defined. Peripheral logic CMOS devices may be completed after this step.

Figure 1G:
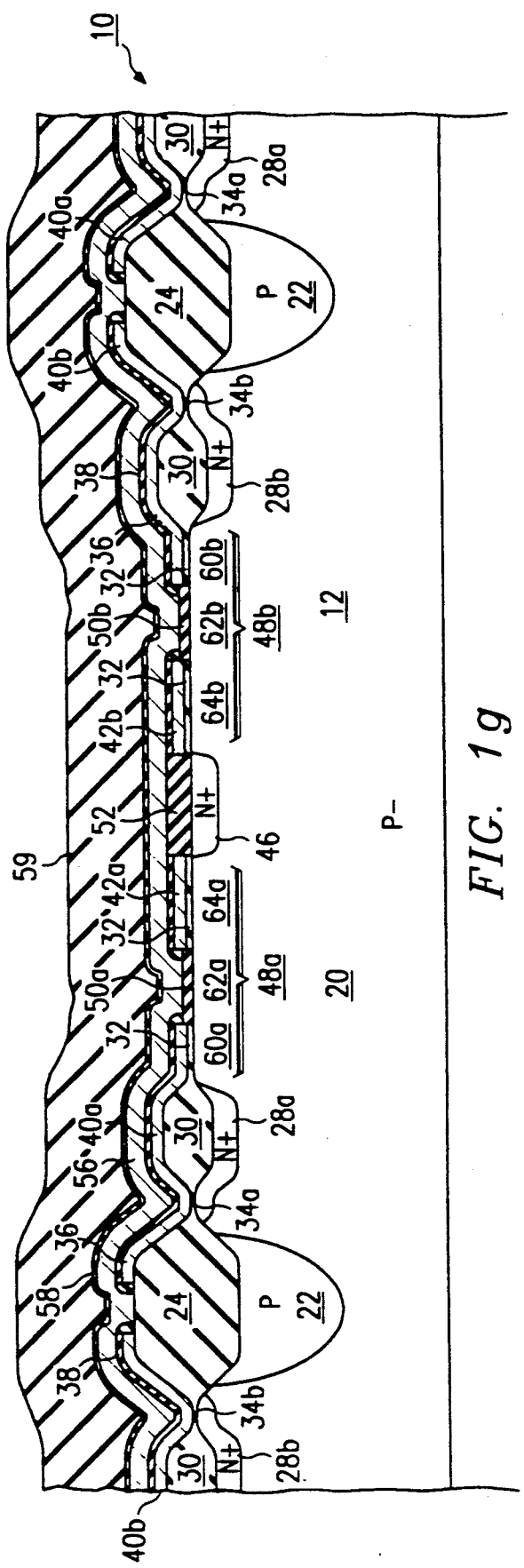

Referring next to FIG. 1g, a cap oxide layer 58 is grown after the poly 2 deposition and etch process on the sides and top of the stack. A borophosphosilicate glass (BPSG) layer 59 is then deposited over the face.

Off-array contacts (not shown) are made through the BPSG layer 59 and cap oxide layer 58, as are on-array contacts (not shown; see FIG. 2) that are made from metal bit lines (not shown) to respective diffused regions 28a, 46 and 28b periodically in a y-direction. The metal bit lines are formed on the BPSG layer 59 to run over and be parallel to the respective diffused regions 28a, 46 and 28b.

In the completed device, channel region 48a consists of three subchannel regions 60a, 62a and 64a in the case of channel region 48a, and channel region 48b consists of subchannel regions 60b, 62b and 64b. The floating gate conductors 40a and 40b respectively control the conductances of the subchannel regions 60a and 60b. The field plate conductor 42a controls the conductance of subchannel region 64a, while the field plate conductor 42b controls the conductance of subchannel region 64b. Lastly, the word line conductor 56 controls the conductance of subchannel regions 62a and 62b. At the termination of the fabrication process, the gate oxide layers 50a and 50b have grown to a thickness of approximately 400 to 500 angstroms.

Figure 2:
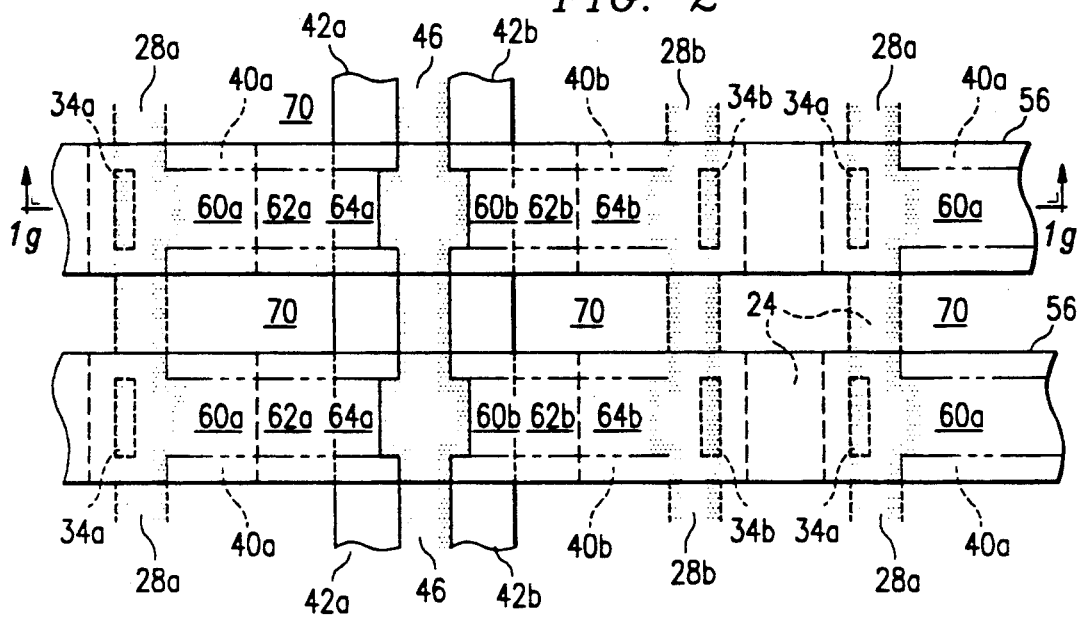
FIG. 2 is a plan view of a section of a memory cell array, the sectional view of FIG. 1g corresponding substantially to line 1g—1g of FIG. 2.

The embodiment shown in FIGS. 1g and 2 can be altered such that only one field plate conductor 42a or 42b need be provided. The principal purpose of the field plate conductors 42a and 42b is to isolate one cell in a pair from the other during cell operations. Hence, only one of the field plate conductors 42a or 42b is absolutely necessary for proper operation of the device.

Referring next to FIG. 2, a highly magnified schematic plan view of certain elements of a EEPROM memory cell array is shown, with the section of view shown in FIG. 1g corresponding substantially to line 1g—1g of FIG. 2. Certain structural components of the array, such as gate oxide layers, have been omitted for the sake of clarity.

The source regions 28a and 28b are elongate diffused bit lines that run in a y-direction (vertical in FIG. 2). In FIG. 2, six floating gate conductors are shown with dashed margins at 40a and 40b. The field plate conductors 42a and 42b are elongate in a y-direction and laterally define the diffused drain region 46. Also shown are the placement of tunnel window oxide layers 34a and 34b, and subchannel regions 60a, 62a, 64a, 60b, 62b and 64b for each of two pairs of cells. The tunnel windows 34a and 34b can be as long as the width of the stack etch in the y-direction.

Two control gate conductors 56 are shown. Control gate conductors 56 are elongate in a horizontal (x) direction and each form a word line for a row of cells.

The boundaries of rectangular isolating field oxide regions 70 are partially indicated by dot-and-dash borders. These oxide regions are created at the face 16 of the silicon layer 12 at the same time that oxide regions 24 (see FIG. 1a) are created. Oxide regions 70 define the boundaries of the channel regions 48a and 48b (see FIG. 1g) in a columnar direction.

FIGS. 3a–3g are highly magnified schematic sectional views showing successive stages in the fabrication of a pair of EEPROM cells according to a second embodiment of the invention. Much of the structure described in FIGS. 1a–1g is similar to the structure shown in FIGS. 3a through 3g. Therefore, like numbers identify like components throughout FIGS. 1a–1g and 3a–3g. The discussion of FIGS. 3a–3g will largely be limited to the differences of the second embodiment as compared to the first.

The fabrication process is similar to that for the first embodiment up to the patterning and etching of the first poly layer 36. Referring to FIG. 3d, the poly 1 layer 36 is patterned and etched to define (in an x-direction) the floating gate conductors 40a and 40b, and a single field plate conductor 100. The field plate conductor is elongate in a y-direction that is perpendicular to the page in FIG. 3d. Field plate conductor 100 defines a normally (P) type inversion region 102 whose boundaries are approximately shown by the dashed lines. Referring next to FIG. 3e, a pair of control gate oxide layers 50a and 50b will be formed at the time that end oxide regions 54 are formed. The process steps illustrated in FIGS. 3e and 3f are similar to the steps shown in FIGS. 1e and 1f.

Figure 3A:
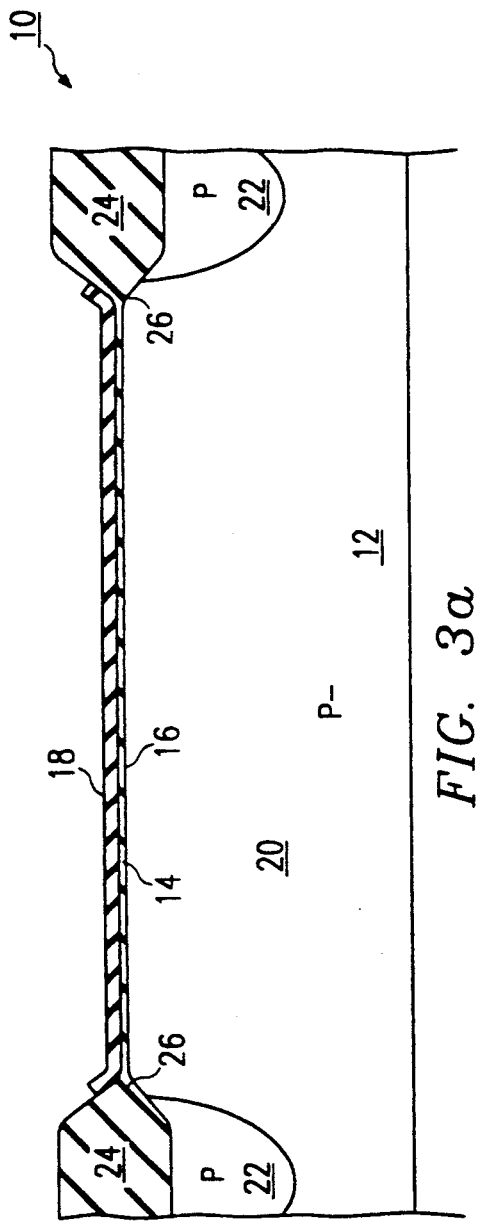
Figure 3B:
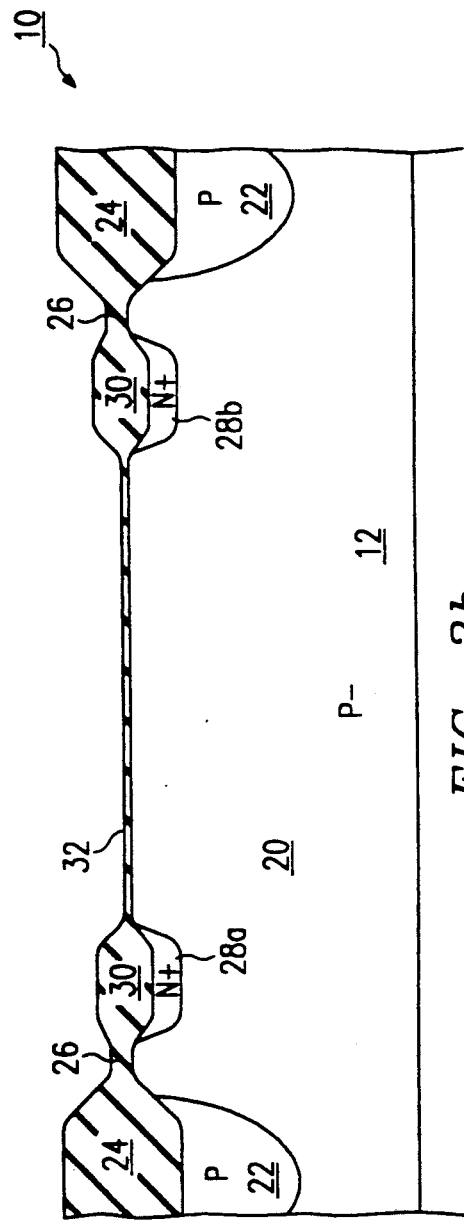
Figure 3G:
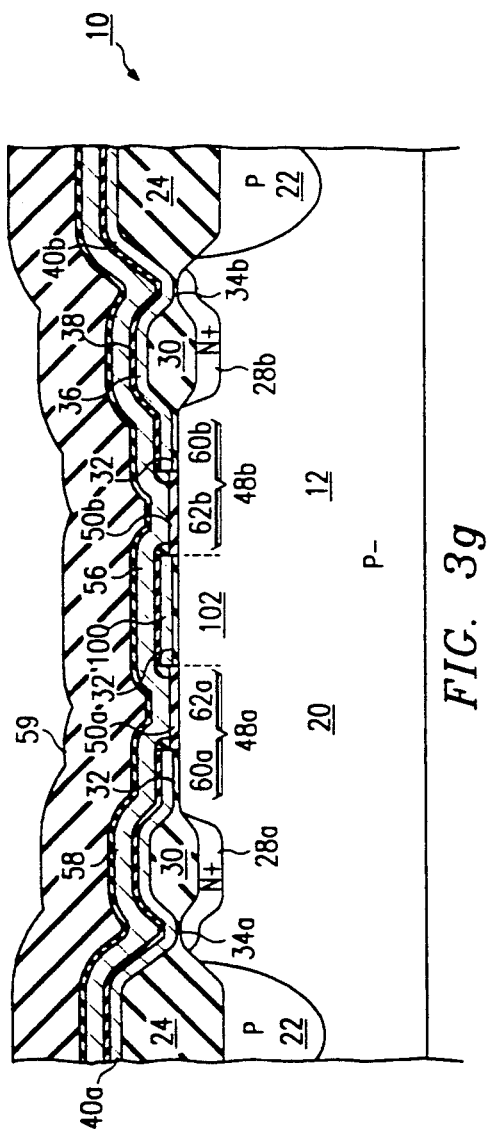

Referring to FIG. 3g, the device in near-final form has two channel regions 48a and 48b. Channel region 48a comprises a floating gate subchannel region 60a and a control gate subchannel region 62a, while channel region 48b correspondingly consists of a floating gate subchannel region 60b and a control gate subchannel region 62b.

A comparison of FIGS. 1g and 3g is instructive to discern the differences between the two embodiments. In FIG. 1g, a drain 46 is adjacent to channel regions 48a and 48b. Each channel region 48 consists of three subchannel regions 60, 62 and 64. The subchannel regions 64a and 64b have their conductance controlled by one of the dual field plate conductors 42a or 42b. In this embodiment, then, the existence of a transistor current path to the drain region 46 is controlled by the field plate conductors 42a and 42b.

By way of contrast, in FIG. 3g each channel region 48a and 48b consists of only two subchannel regions 60 and 62. The field plate conductor 100 controls the conductivity type of the inversion region 102, which has been substituted for the drain region 46 in FIG. 1g.

Figure 4:
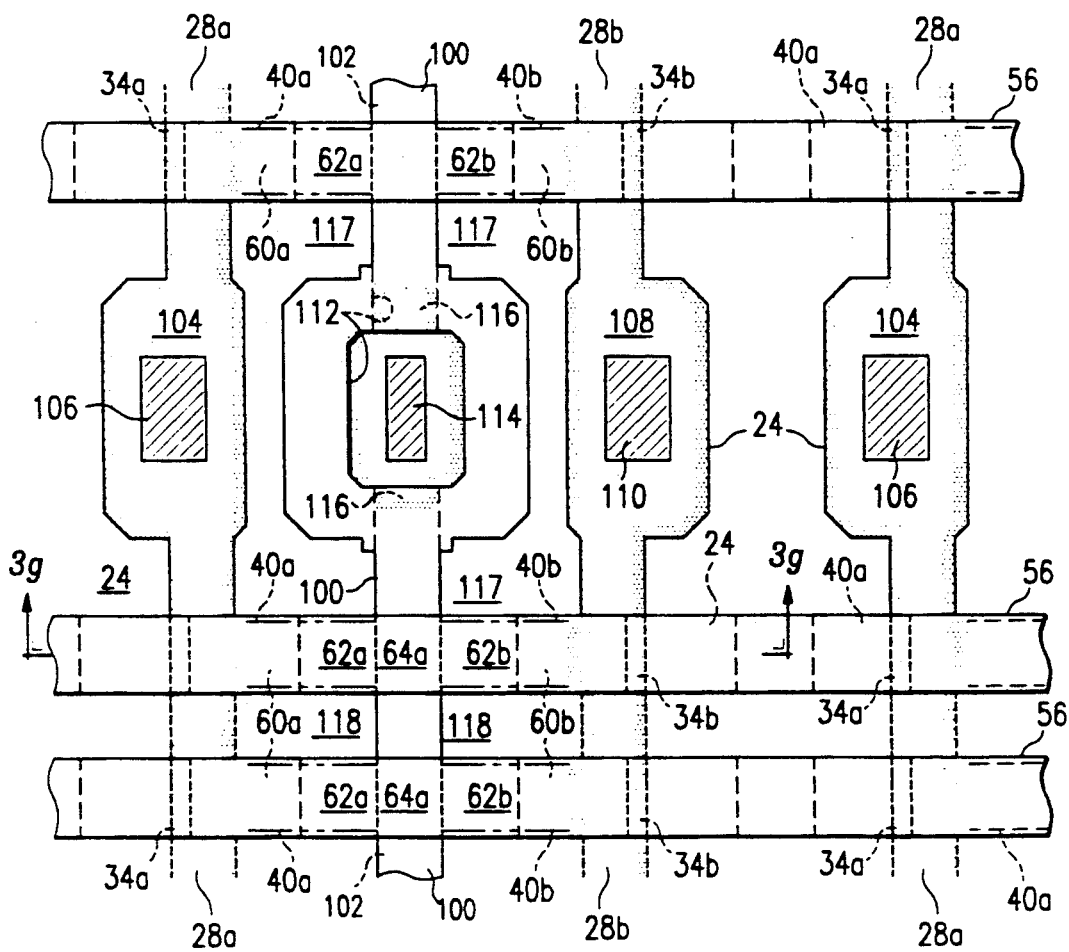
FIG. 4 is a plan view of a section of a memory cell array according to the second embodiment of the invention, the sectional view of FIG. 3g corresponding substantially to line 3g—3g of FIG. 4.

Turning now to FIG. 4, a plan view of the second embodiment of the invention is shown. FIG. 4 is a highly magnified plan view of a portion of a memory cell array having cells according to the second embodiment of the invention. Section 3g—3g of FIG. 4 corresponds substantially to the sectional view shown in FIGS. 3a-3g. Between FIGS. 2 and 4, like numbers identify like components. Diffused regions in the silicon are represented by stippled borders, and contacts are diagonally striped.

The array is laid out in columns that are oriented vertically in FIG. 4 and in rows that are oriented horizontally in FIG. 4. Each column of cell pairs includes two elongate diffused bit lines 28a and 28b, and a field plate conductor 100. As mentioned above, the field plate conductor 100 defines an inversion region 102 whose conductivity type is reversed from (P) to (N) upon the application of a predetermined voltage to the field plate conductor 100.

For each row, a wordline conductor 56 is shown that runs over the first poly conductors 40a and 40b in each row. The horizontal edges of the first poly conductors 40a and 40b, the interlevel oxide 38 (not shown; see FIG. 3g) and the wordline conductors 56 are defined in the stack etch mentioned above. Also shown are the subchannel regions 60a, 62a, 62b and 60b for each of three pairs of cells. The tunnel oxide windows are shown at 34a and 34b as represented by dashed rectangles, and may extend for the entire width of the word line conductor 56 under which they reside.

A diffused contact area 104 is an integral widening of the bit line 28a. A contact 106 is made through various passivating layers (not shown) to the diffused region 104 for electrical connection of the array to the exterior. Similarly, a diffused contact region 108 is an integral widening of bit line 28b, and a contact 110 is made to electrically connect the bit line or source region 28b to the exterior of the array.

A diffused contact region 112 is provided to make electrical connection to the inversion region 102 from above. The diffused contact region 112 is formed at the same time that the buried bit lines 28a and 28b are formed (see the discussion relating to FIG. 1a above). A contact 114 is made to the approximate center of the diffused contact region 112. The field plate conductor 100 is routed around the contact 114 to be electrically insulated from the contact 114. Nevertheless, an intentional overlap exists between the diffused contact area 112 and the field plate conductor 100 within areas 116. When a sufficient voltage has been applied to the field plate conductor 100, a conductive path will be established from the contact 114 through the diffused contact area 112 and into the inversion region 102, as the inversion region 102 has a common boundary with the permanent (N+) region 112. In this manner, an electrical connection can be made to the inversion region 102 for each of a plurality of cells in the same column.

Contact areas 104, 108 and 112 are periodically repeated up and down the columns in the array by a predetermined number of rows, and are, for each repetition, disposed in the array in a special row in between two predetermined control gate conductors 56. Each set of contact regions 104, 108 and 112 are periodically repeated in a row direction for each column. As explained in conjunction with FIG. 1g, contacts are made between the diffused bit lines 28a and 28b and from the diffused contact region 116 to metal bit lines overlying and parallel to bit lines 28a and 28b and inversion region 102.

Isolating oxide regions 117 define the transverse boundaries of diffused contact region 112, and act to isolate the contact region 112 from adjacent bit lines 28a and 28b. The field plate conductor 100 is partially routed over the oxide regions 117 where it splits to avoid contact 114. Rectangular isolating oxide regions 118 help define the transverse boundaries of bit lines 28a and 28b and inversion region 102, and isolate adjacent channel regions 48a and 48b (composed of subchannel regions 60a, 62a, 60b, 62b and; see FIG. 3g) from each other in a longitudinal direction. The boundaries of isolating oxide regions 117 and 118 are partially shown by dotted-and-dashed lines, and are formed at the face 16 of silicon layer 12 at the same time as oxide regions 24 (see FIG. 3a). Oxide regions 24 are continuous in a longitudinal direction.

Figure 5:
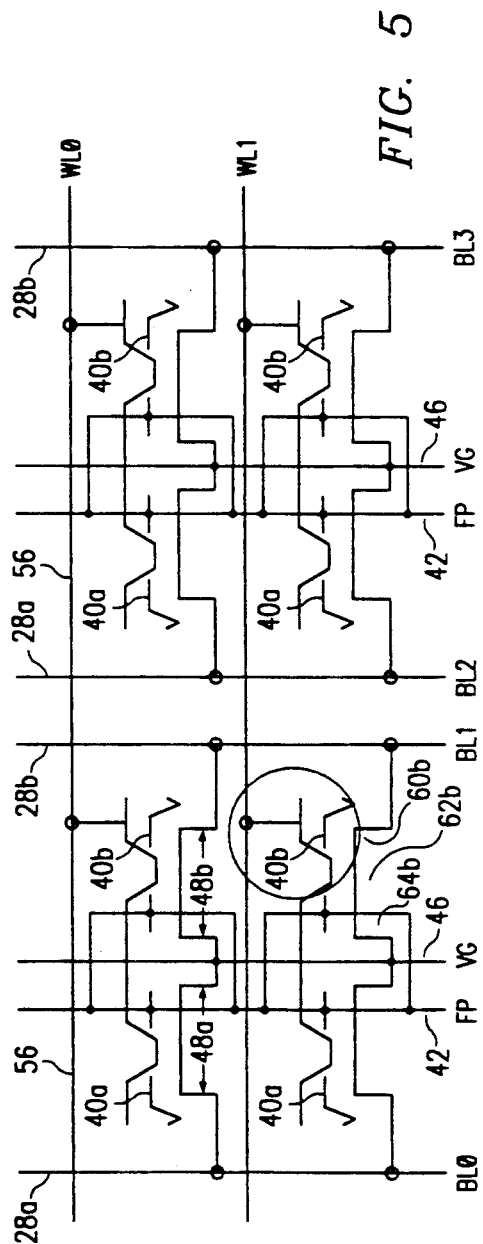
FIG. 5 is an electrical schematic diagram of a small section of an array of cells according to the invention.

FIG. 5 is an electrical schematic diagram of four pairs of EEPROM cells. In FIGS. 1-2 and 5, like characters identify like parts so that the structural components of the EEPROM cells and their electrical representations may be compared. Each row of cells is provided with a word line conductor WL0 or WL1. Each column of cell pairs is provided with two bit lines such as BL0, BL1. Each column of cells further has a drain connection or virtual ground 46 and a field plate conductor 42. The conductances of various subchannel regions of channel regions 48a and 48b (see FIG. 1g and cells 0,0 and 0,1) are respectively controlled by the floating gate conductors 40a and 40b, the control gate 56 and the field plate conductor 42.

The operation of the cell can best be described in conjunction with FIG. 5, the table of voltages given below, and FIG. 6.

TABLE

| | READ, WRITE AND ERASE VOLTAGES | | | | |
|---|---|---|---|---|---|
| | Read | | Write | Erase | |
| | Alt1 | Alt2 | "0" | Selected | Flash |
| Selected Word Line (Control Gate) | 3V | 3V | ≈18V | −5V | −10V |
| Deselected Word Lines | 0V | 0V | 7V–10V | 10V | — |
| Selected Bit Line (Source Region) | 0V | 1.5V | 0V | 10V | 5V |
| Deselected Bit Lines (Source Regions) | Float | 0V | 6V–7V | 0V | 5V |
| Drain | ≈1.5V | 0V | Float | Float | Float |
| Poly 1 Field Plate | 5V | 5V | ≦0V | ≦0V | ≦0V |

Figure 6:
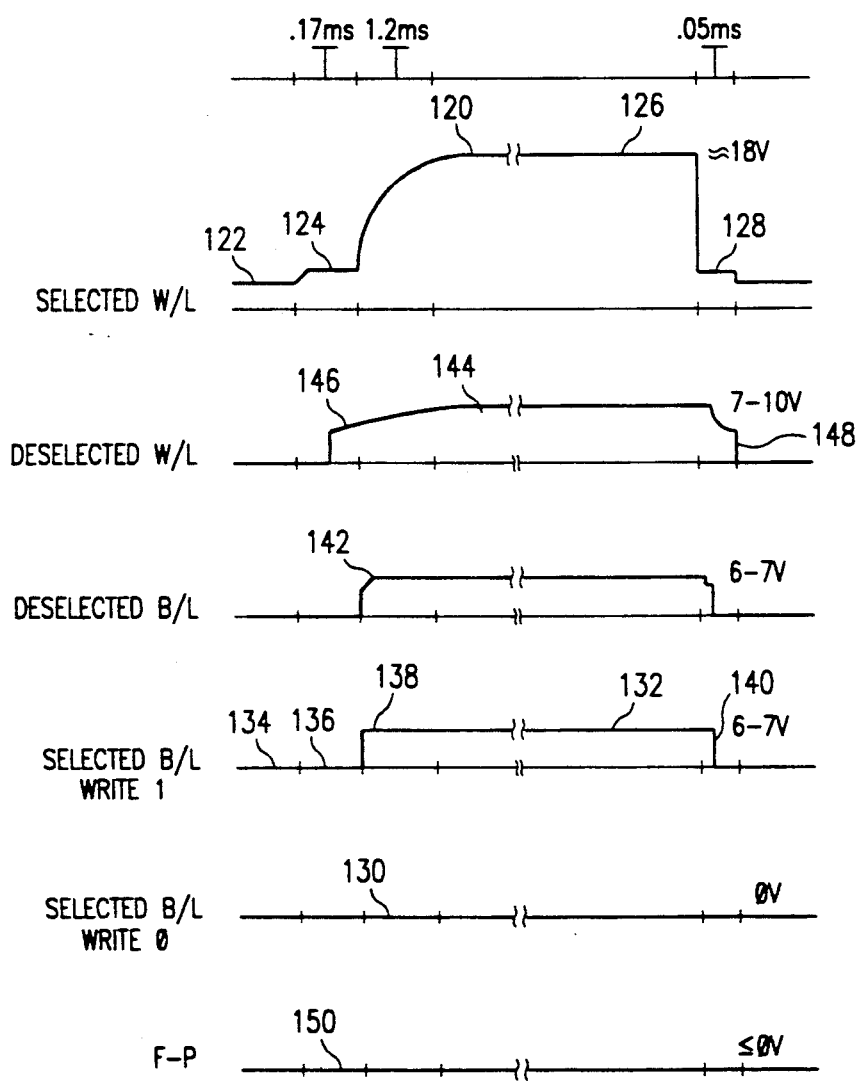
FIG. 6 is a set of voltage timing diagrams illustrating applied voltages during the programming of a selected EEPROM cell.

FIG. 6 is a voltage/timing diagram for various inputs of the device in writing to one particular floating gate conductor, such as that within cell (1,1) shown circled in FIG. 5.

Curve 120 is that of the voltage on the selected word line WL1. Before the program command is acknowledged, the voltage value of this word line is the "read mode" value of approximately 3 volts. This is shown by curve segment 122. Upon acknowledgment of the program command, the voltage value of this word line is first changed to $V_{DD}$ during a small period of time such as 0.17 milliseconds, and is then raised to the full programming voltage of 18 volts during a time of 1.2 milliseconds. The curved, smooth transition from $V_{DD}$ at 124 to the 18 volt level at 126 is required to limit the electrical field stress across the memory cell.

The programming time at 18 volts is selected to be sufficiently long to program the floating gate conductor 40b with a negative voltage such as $-2$ to $-4$ volts. After the specified programming time has elapsed, the voltage value of the word line is changed rapidly from 18 volts back to $V_{DD}$ at 128, where it stays for a period of 0.05 milliseconds. Thereafter, the voltage value is further reduced to the "read mode" value where it will remain until a further program command is acknowledged.

Where a "0" is desired to be written, the voltage curve on the selected bit line BL1 is shown at 130. The voltage of the selected bit line remains at 0 volts throughout all times of the programming period, such that a voltage difference of approximately 18 volts exists between the word line conductor WL1 and the selected bit line BL1. This will cause electrons to tunnel through the respective tunnel window 34b (see FIG. 1g or 3g) under the influence of a strong electric field. A "zero" will be written to the floating gate conductor 40b. The presence of a substantial negative voltage on the floating gate conductor 40b will in turn render the subchannel region 60b (FIG. 1g or 3g) nonconductive; reading the source region 28b (FIGS. 2 or 4) as a result will yield a "zero" bit.

Where a "one" is desired to be written to the cell (1,1), a curve 132 will exist on BL1 during the programming phase. Within segments 134 and 136, the voltage on the selected bit line BL1 remains in its "read mode" state of 0 volts. After the selected word line has begun to be raised to 18 volts, the voltage value of BL1 is raised to a value in the range of 6 to 7 volts at time 138. In the first illustrated embodiment (FIGS. 1-2) the coupling coefficient between the word line conductor 56 and the floating gate conductor 40b is approximately 0.7 to 0.8. Therefore, a programming voltage of 18 volts on a word line conductor will be reflected in a voltage of approximately 12 to 13 volts on the floating gate conductor 40b. The voltage difference between the floating gate conductor at 12 to 13 volts and BL1 at 6 to 7 volts is insufficient to cause programming of the floating gate conductor 40b through Fowler-Nordheim tunneling.

At time 140, the voltage value of the selected bit line is reduced back to its "read mode" state of 0 volts. This occurs after the voltage value of the selected word line has been dropped from $V_{PP}$ to $V_{DD}$ during segment 128. The voltage curve for deselected bit lines, such as BL0, BL2 and BL3 in FIG. 5, is shown at 142.

Before the program command is acknowledge, the voltage value of the deselected bit lines will be the "read mode" value of 0 volts. After the program command has been acknowledged, the voltage value of the deselected bit lines will remain at 0 volts until the voltage value of the selected word line WL1 is raised from $V_{DD}$ to 18 volts. Concurrently or before the word line begins to be raised from $V_{DD}$ to 18 volts, the voltage value of the deselected bit lines is raised, where it stays throughout the programming. Concurrently with or after the decrease of the voltage of the selected word line WL1 from 18 volts to $V_{DD}$, the voltage of the deselected bit lines is decreased back to 0 volts. This deselected bit line voltage prevents "write disturb" of nonselected bits sharing the selected bit line.

A voltage timing diagram for the deselected word lines, such as WL0 in FIG. 5, is shown at 144. As described above, it is necessary to apply 6 to 7 volts to the deselected bit lines as well as those selected bit lines where "1" is desired to be written to the selected bit. These bit line voltages in turn create a possibility of erasing previously programmed bits associated with the deselected word lines. To avoid this erase disturb, it is preferred that the voltage of the deselected word lines be raised starting at time 146 to a voltage in the range of 7 to 10 volts before the deselected bit line voltage is raised from 0 volts to 6 to 7 volts. After ramping up to 7 to 10 volts, the voltage of the deselected word lines remains at this value throughout the programming. The voltage value is dropped back to its "read mode" state of 0 volts at time 148, which occurs only after the voltage value on the deselected bit lines has been reduced to its read mode state of 0 volts.

The voltage curve for the field plate conductor 42 (FIG. 5) is shown at 150. During the programming mode, the voltage of the field plate conductor 42 remains at 0 volts or a negative voltage value to prevent any drain to source current.

In order to read a cell, a voltage of about 3 volts is placed on the selected word line WL1. This control gate read voltage is selected so as to be sufficient to render channel subregions 62a and 62b (FIGS. 1g or 3g) conductive, but nonetheless to be low enough to prevent a disturb of the floating gate conductors 40a and 40b. Deselected word lines (WL0, WL2) have zero volts impressed on them so as to render subchannel regions 62a and 62b non-conductive for all cells in deselected columns.

The Table gives first and second alternative methods for reading the cell, under appropriate columns labelled Alt1 and Alt2. According to the Alt1 method, the selected bit line BL1 has zero volts impressed thereon, and the drain 46 has a positive voltage $V_{dd}$ such as 1.5 volts impressed on it to cause a potential drop to exist between the drain region 46 and the selected bit line BL1. To complete conductance across the entire channel region 48b (FIG. 1g), the field plate conductor 42 has a predetermined voltage, such as five volts, placed on it that is sufficient to render the subchannel region 64b (FIG. 1g) conductive. Therefore, whether the entire channel region is rendered conductive or not will depend on the present electric potential of the floating gate conductor 40b, which in turn controls the conductance of the channel subregion 60b (FIG. 1g). In this manner, the presence or absence of current can be detected at the selected bit line BL1.

According to the second alternative method Alt 2, the deselected bit lines or source regions are allowed to float. The drain is held at zero volts while about 1.5 volts is placed on the selected bit line.

In order to do a selected erase, the selected word line WL1 has a negative potential such as $-5$ volts impressed on it. Meanwhile, the selected bit line BL1 has a positive voltage such as ten volts impressed on it. The deselected bit lines BL0, BL2 and BL3 meanwhile have a lower potential such as 0 volts impressed on them. There will therefore be an electric field adequate for an erase between the selected word line WL1 and the selected bit line BL1 while a small electric field that is insufficient to cause an erase will exist between the deselected word lines and the selected bit line BL1. During erasing, the excess electrons will be removed from the floating gate conductor 40b and hence the "zero" state will be erased. Also, during this erase operation, the drain region 46 (FIG. 1g) is allowed to float, and the field plate conductor 42 is held at zero volts or a negative voltage value to render the subchannel region 64b non-conductive.

To perform a flash-erase, all word lines 56 will have a negative potential such as −10 volts impressed on them, and all bit lines will have a positive potential such as five volts impressed on them.

An alternative, selective erasing method is to apply a large positive voltage such as 15 volts to the selected source region 28b, allow the selected drain region 46 to float, and connecting the selected control gate 56 to reference potential or zero volts. The use of this erasing method avoids the need for a negative voltage supply.

The operation of the EEPROM embodiment shown in FIGS. 3-4 is in general similar to that described above. To perform a read operation of a selected cell, such as cell (1,1) in FIG. 5, the field plate conductor 100 (FIG. 3g) has a voltage (such as 5 volts) applied to it that is sufficient to invert the inversion region 102 from (P) type to (N) type. A conductive path between the selected source region 28b and the inversion region contact 114 (FIG. 4) will be established, once the control gate conductor 56 has V$_{DD}$ applied to it and if the floating gate conductor 40b has a positive voltage stored on it. During programming and erase operations, the field plate conductor 100 will have zero or a negative voltage applied to it, and thus the inversion region 102 will remain noninverted and (P) type. In this condition the inversion region contact 114 (FIG. 4) will be isolated from any cell affected by programming or erasure, and no drain to source current will be present.

In summary, a "flash-eraseable" electrically programmable read only memory cell has been shown and described, wherein two adjacent columns of such cells share the same drain region, thus saving device area and relaxing metal pitch, since only 1½ metal column conductors are required per cell. In one embodiment, the drain region is flanked by field plate conductors to insure isolation between adjacent cells. In another embodiment, the field plate conductor instead causes an inversion region or virtual drain region to invert when a read operation is desired, but not otherwise; this provides effective isolation between adjacent cells and saves further device area.

While preferred embodiment of the invention and their advantages have been set forth in the above detailed description, the invention is not limited thereto but only by the scope and spirit of the appended claims.

What is claimed is:

1. A method for fabricating an array of rows and columns of nonvolatile memory cells at a face of a semiconductor layer having a first conductivity type, comprising the steps of:

forming a plurality of pairs of substantially parallel source regions of a second conductivity type opposite said first conductivity type in a column direction at the face;

forming an insulator layer on the face;

forming a first conductor layer over the insulator layer; and etching the first conductor layer to form, for each pair of source regions, at least one field plate conductor elongate in the column direction and laterally spaced between said pair of source regions.

2. The method of claim 1 in which the step of etching the first conductor layer includes defining a plurality of floating gate conductor strips to be elongate in a column direction, each floating gate conductor strip disposed insulatively adjacent a respective source region.

3. The method of claim 2, and further comprising the steps of:

forming an interlevel insulator layer over the floating gate conductor strips and the field plate conductors;

forming a second conductor layer on the insulator layer; and stack etching the second conductor layer, the interlevel insulator layer and the floating gate conductor strips to define, for each of a plurality of parallel rows formed at an angle to said columns, a word line conductor formed from said second conductor layer and a plurality of floating gate conductors having edges in a row direction which are aligned with respective edges of the word line conductor.

4. The method of claim 1, in which the step of etching the first conductor layer includes forming, for each pair of source regions, a pair of spaced-apart field plate conductors elongate in the column direction and laterally spaced between said pair of source regions.

5. The method of claim 4 further comprising the steps of:

removing the insulator layer within an area between each pair of spaced-apart field plate conductors; and forming an elongate drain region of the second conductivity type at the face in between each pair of spaced-apart field plate conductors.

6. The method of claim 5, in which each drain region is self-aligned with longitudinal edges of the pair of spaced-apart field plate conductors it is formed in between.

7. The method of claim 1, in which the step of forming an insulator layer on the face includes forming a thick insulator region over each source region and, for each row, a thin window insulator region adjacent one side of each thick insulator region.

8. The method of claim 7, in which said one side of each thick insulator region is separated from a channel region in the semiconductor layer located between a pair of source regions by said thick insulator region.

9. The method of claim 1, further comprising the step of forming channel stop regions at the face, said channel stop regions being located between adjacent pairs of source regions.

10. The method of claim 9, in which the channel stop regions are of the first conductivity type.

11. The method of claim 1, further comprising the step of forming, for each pair of source regions, an elongate drain region of the second conductivity type at the face adjacent said at least one field plate conductor.

12. The method of claim 1, further comprising the steps of:

forming, for each pair of source regions, a diffused contact region between said pair of source regions and between predetermined rows, said at least one field plate conductor overlapping a portion of said diffused contact region; and forming a contact to said diffused contact region, said at least one field plate conductor being routed around said contact to be electrically insulated from said contact.

13. A method for fabricating a pair of nonvolatile memory cells at a face of a semiconductor layer having a first conductivity type, comprising the steps of:

forming a pair of substantially parallel source regions of a second conductivity type opposite said first conductivity type in a column direction at the face;

forming an insulator layer on the face;

forming a first conductor layer over the insulator layer; and etching the first conductor layer to form at least one field plate conductor elongate in the column direction and laterally spaced between said pair of source regions.

14. The method of claim 13 in which the step of etching the first conductor layer includes defining a pair of floating gate conductor strips to be elongate in a column direction, each floating gate conductor strip disposed insulatively adjacent a respective source region.

15. The method of claim 14, and further comprising the steps of:

forming an interlevel insulator layer over the floating gate conductor strips and said at least one field plate conductor;

forming a second conductor layer on the insulator layer; and stack etching the second conductor layer, the interlevel insulator layer and the floating gate conductor strips to define a word line conductor formed from said second conductor layer and a pair of floating gate conductors having edges in a row direction which are aligned with respective edges of the word line conductor.

16. The method of claim 13, in which the step of etching the first conductor layer includes forming a pair of spaced-apart field plate conductors elongate in the column direction and laterally spaced between said pair of source regions.

17. The method of claim 16 further comprising the steps of:

removing the insulator layer within an area between said pair of spaced-apart field plate conductors; and forming an elongate drain region of the second conductivity type at the face in between said pair of spaced-apart field plate conductors.

18. The method of claim 17, in which said drain region is self-aligned with longitudinal edges of the pair of spaced-apart field plate conductors.

19. The method of claim 13, in which the step of forming an insulator layer on the face includes forming a thick insulator region over each source region and a thin window insulator region adjacent one side of each thick insulator region.

20. The method of claim 19, in which said one side of each thick insulator region is separated from a channel region in the semiconductor layer between said source regions by said thick insulator region.

21. The method of claim 13, further comprising the step of forming an elongate drain region of the second conductivity type at the face adjacent said at least one field plate conductor.

22. A method for fabricating a nonvolatile memory cell at a face of a semiconductor layer having a first conductivity type, comprising the steps of:

forming a source region of a second conductivity type opposite said first conductivity type in a column direction at the face;

forming an insulator layer on the face;

forming a first conductor layer over the insulator layer; and etching the first conductor layer to form a field plate conductor elongate in the column direction and laterally spaced from said source region.

23. The method of claim 22 in which the step of etching the first conductor layer includes defining a floating gate conductor strip to be elongate in a column direction, said floating gate conductor strip disposed insulatively adjacent a respective source region.

24. The method of claim 23, and further comprising the steps of:

forming an interlevel insulator layer over the floating gate conductor strip and said field plate conductor;

forming a second conductor layer on the insulator layer; and stack etching the second conductor layer, the interlevel insulator layer and the floating gate conductor strip to define a word line conductor formed from said second conductor layer and a floating gate conductor having edges in a row direction which are aligned with respective edges of the word line conductor.

25. The method of claim 22 further comprising the steps of:

removing the insulator layer within an area adjacent said field plate conductor; and forming an elongate drain region of the second conductivity type at the face in said area adjacent said field plate conductor.

26. The method of claim 25, in which said drain region is self-aligned an edge of the field plate conductor.

27. The method of claim 22, in which the step of forming an insulator layer on the face includes forming a thick insulator region over said source region and a thin window insulator region adjacent one side of said thick insulator region.

28. The method of claim 27, in which said one side of said thick insulator region is separated from a channel region in the semiconductor layer between said source region and said field plate conductor by said thick insulator region.

* * * * *